US011960166B2

(12) United States Patent
Usukura et al.

(10) Patent No.: US 11,960,166 B2
(45) Date of Patent: Apr. 16, 2024

(54) DISPLAY DEVICE

(71) Applicant: Sharp Display Technology Corporation, Kameyama (JP)

(72) Inventors: Naru Usukura, Kameyama (JP); Masahiro Imai, Kameyama (JP); Yuhichiroh Murakami, Kameyama (JP); Takahiro Yamaguchi, Kameyama (JP); Shige Furuta, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/102,904

(22) Filed: Jan. 30, 2023

(65) Prior Publication Data

US 2023/0244101 A1 Aug. 3, 2023

(30) Foreign Application Priority Data

Feb. 1, 2022 (JP) .................. 2022-014177

(51) Int. Cl.
*G02F 1/1335* (2006.01)
*G02F 1/13357* (2006.01)
*G02F 1/1362* (2006.01)
*G02F 1/1368* (2006.01)

(52) U.S. Cl.
CPC .. *G02F 1/133536* (2013.01); *G02F 1/133504* (2013.01); *G02F 1/133524* (2013.01); *G02F 1/133603* (2013.01); *G02F 1/136286* (2013.01); *G02F 1/1368* (2013.01)

(58) Field of Classification Search
CPC .................................. G02F 1/1335
See application file for complete search history.

(56) References Cited

U.S. PATENT DOCUMENTS

| | | | |
|---|---|---|---|
| 2003/0053173 A1* | 3/2003 | Patel | H04B 10/532 398/152 |
| 2005/0092965 A1* | 5/2005 | Ishizaki | C09K 19/52 252/299.5 |
| 2007/0064180 A1* | 3/2007 | Hasegawa | G02F 1/133504 349/112 |
| 2011/0049444 A1* | 3/2011 | Sako | C09B 69/04 252/586 |
| 2013/0050602 A1* | 2/2013 | Macpherson | G02F 1/134363 349/41 |
| 2016/0283028 A1* | 9/2016 | Yamazaki | G02F 1/13306 |
| 2019/0355928 A1* | 11/2019 | Narutaki | G02F 1/1335 |
| 2020/0019010 A1* | 1/2020 | Usukura | G02F 1/13476 |
| 2020/0159055 A1* | 5/2020 | Robinson | G02F 1/137 |

FOREIGN PATENT DOCUMENTS

JP 5468766 B2 4/2014
JP 6700079 B2 5/2020

* cited by examiner

*Primary Examiner* — Sang V Nguyen
(74) *Attorney, Agent, or Firm* — ScienBiziP, P.C.

(57) ABSTRACT

A display device includes an organic EL element layer, a liquid crystal element layer disposed on top of the organic EL element layer, and a polarizing plate disposed at a side of the liquid crystal element layer that faces an observer. The liquid crystal element layer includes two transparent substrates and a liquid crystal layer disposed between the two transparent substrates. The liquid crystal element layer is configured to be able to, by applying a voltage to the liquid crystal layer, cause a substantially quarter-wavelength retardation in light passing through the liquid crystal layer.

19 Claims, 9 Drawing Sheets

DISPLAY DEVICE

BACKGROUND

1. Field

The present disclosure relates to display devices and, in particular, to a display device that is capable of both performing a reflective display using a liquid crystal display element and performing a self-luminous display using an organic EL display element.

2. Description of the Related Art

An organic EL display device is a self-luminous display device that may exhibit superior display performance but needs electric power for light emission. Meanwhile, a reflective liquid crystal display device is suitable for use in a mobile (e.g. a watch) that is used outdoors, as it uses ambient light for display and can therefore perform a display with low power consumption. However, the reflective liquid crystal display device is inferior in display performance (e.g. luminance or color gamut) to the organic EL display device especially in an environment in which the intensity of extraneous light is low.

Given these circumstances, there is demand for a display device that is capable of performing a self-luminous display when a high-quality display is desired and performing a reflective display either in an environment in which extraneous light of sufficient intensity is obtained or when power consumption is reduced.

Japanese Patent No. 6700079 discloses a display device in which a reflective liquid crystal display element and an organic EL display element are stacked on top of each other via a combination of an adhesive layer, an insulating layer, and an adhesive layer. In this display device, the reflective liquid crystal display element has a reflecting electrode and an opening, and is configured such that light emitted by the organic EL display element passes through the opening of the reflective liquid crystal display element. The reflective liquid crystal element and organic EL display element of this display device can each independently perform a display.

In the display device described in Japanese Patent No. 6700079, an area in which to perform a reflective display and an area in which to perform a self-luminous display are separately present (that is, the areas are divided from each other). This makes each of the displays small in effective area. This tends to result in insufficient luminance especially in the reflective display.

Furthermore, a high degree of alignment accuracy is desired when the reflective liquid crystal display element and the organic EL display element are stacked on top of each other via the combination of the adhesive layer, the insulating layer, and the adhesive layer so that light emitted by the organic EL display element efficiently passes through the opening of the reflective liquid crystal display element.

It is desirable to provide a display device in which an area in which to perform a reflective display and an area in which to perform a self-luminous display do not need to be divided from each other and/or that is manufactured in a process that does not need a high-degree of alignment accuracy for the placement of a liquid crystal element with respect to an organic EL display element.

SUMMARY

According to an aspect of the disclosure, there is provided a display device including an organic EL element layer, a liquid crystal element layer disposed on top of the organic EL element layer, and a polarizing plate disposed at a side of the liquid crystal element layer that faces an observer. The liquid crystal element layer includes two transparent substrates and a liquid crystal layer disposed between the two transparent substrates. The liquid crystal element layer is configured to be able to, by applying a voltage to the liquid crystal layer, cause a substantially quarter-wavelength retardation in light passing through the liquid crystal layer.

DESCRIPTION OF THE EMBODIMENTS

The following describes a display device according to an embodiment of the present disclosure with reference to the drawings. The display device according to the embodiment of the present disclosure is not limited to that illustrated below.

Figure 1A:
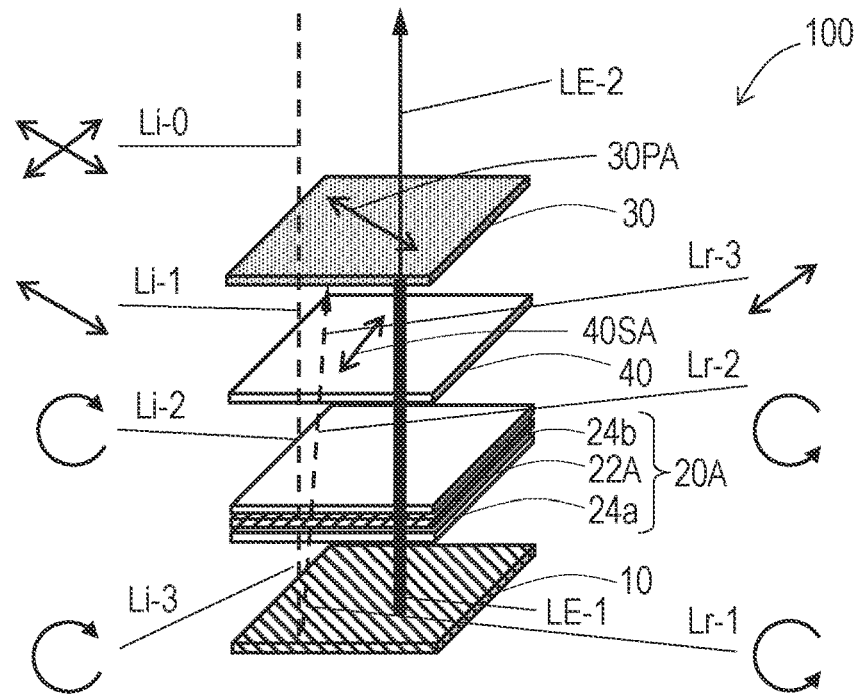
FIG. 1A is a schematic exploded perspective view of a display device according to an embodiment of the present disclosure, and shows an off-state.
Figure 1B:
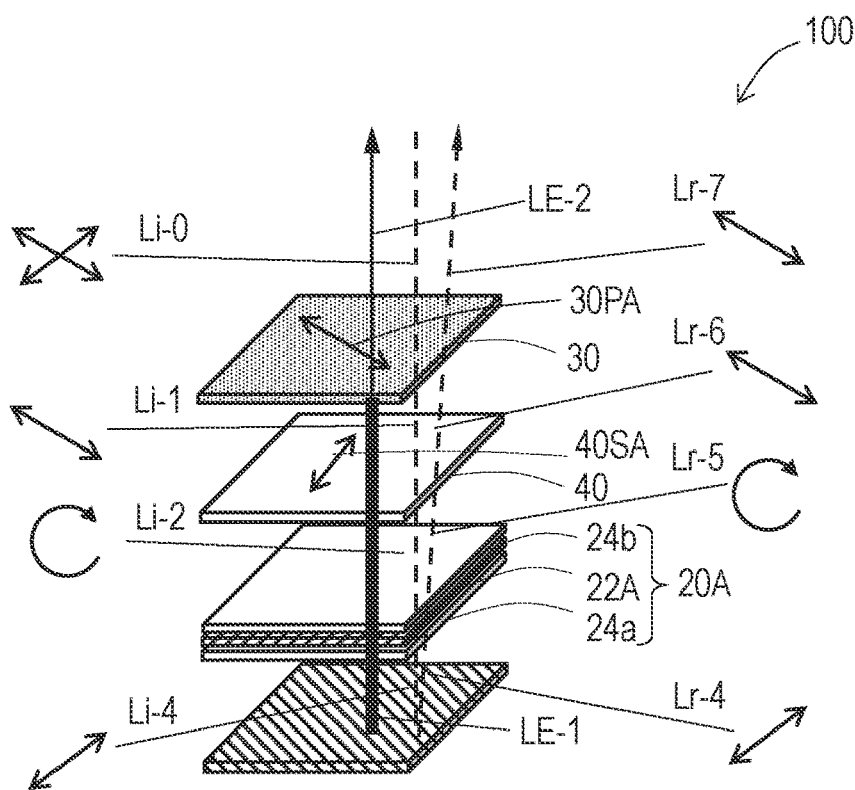
FIG. 1B is a schematic exploded perspective view of the display device according to the embodiment of the present disclosure, and shows an on-state.

FIGS. 1A and 1B are schematic exploded perspective views of a display device 100 according to an embodiment of the present disclosure. FIG. 1A shows an off-state, and FIG. 1B shows an on-state. In FIGS. 1A and 1B, the states of polarization of different lights (unpolarized light, linearly polarized light, and circularly polarized light) are indicated by arrows. Further, the polarizing transmission axis PA of a polarizing plate and the slow axis SA of a phase difference plate are indicated by arrows.

The display device 100 includes an organic EL element layer 10, a liquid crystal element layer 20A disposed on top of the organic EL element layer 10, and a polarizing plate 30 disposed at a side of the liquid crystal element layer 20A that faces an observer. The liquid crystal element layer 20A includes two transparent substrates 24a and 24b and a liquid crystal layer 22A disposed between the two transparent substrates 24a and 24b. The liquid crystal element layer 20A is configured to be able to, by applying a voltage to the liquid crystal layer 22A, cause a substantially quarter-wavelength retardation in light passing through the liquid crystal layer 22A. The display device 100 further includes a phase difference plate 40 disposed between the liquid crystal element layer 20A and the polarizing plate 30; however, depending on a display mode, the phase difference plate 40 may be omitted.

The term "retardation" as used herein means a retardation in light with a wavelength of approximately 550 nm, which is high in luminous efficacy among visible lights. The "substantially quarter-wavelength retardation" refers, for example, to a retardation of 138 nm±20 nm, but may vary according to the desired display quality. From the point of view of a contrast ratio, it is preferable that the liquid crystal layer 22A be of a VA mode; however, various modes such as a transverse electric field mode and a TN mode may be used.

Note here that the liquid crystal element layer 20A and the polarizing plate 30 are configured to perform a reflective display using light reflected within the organic EL element layer 10 and perform a self-luminous display using light emitted by the organic EL element layer 10. The liquid crystal element layer 20A has no reflective layer, and does not function as a reflective liquid crystal display element even when combined with the polarizing plate 30. Further, the display device 100 has no polarizing plate between the liquid crystal element layer 20A and the organic EL element layer 10; therefore, the liquid crystal element layer 20A is unable to constitute a transmissive liquid crystal display element.

Figure 10:
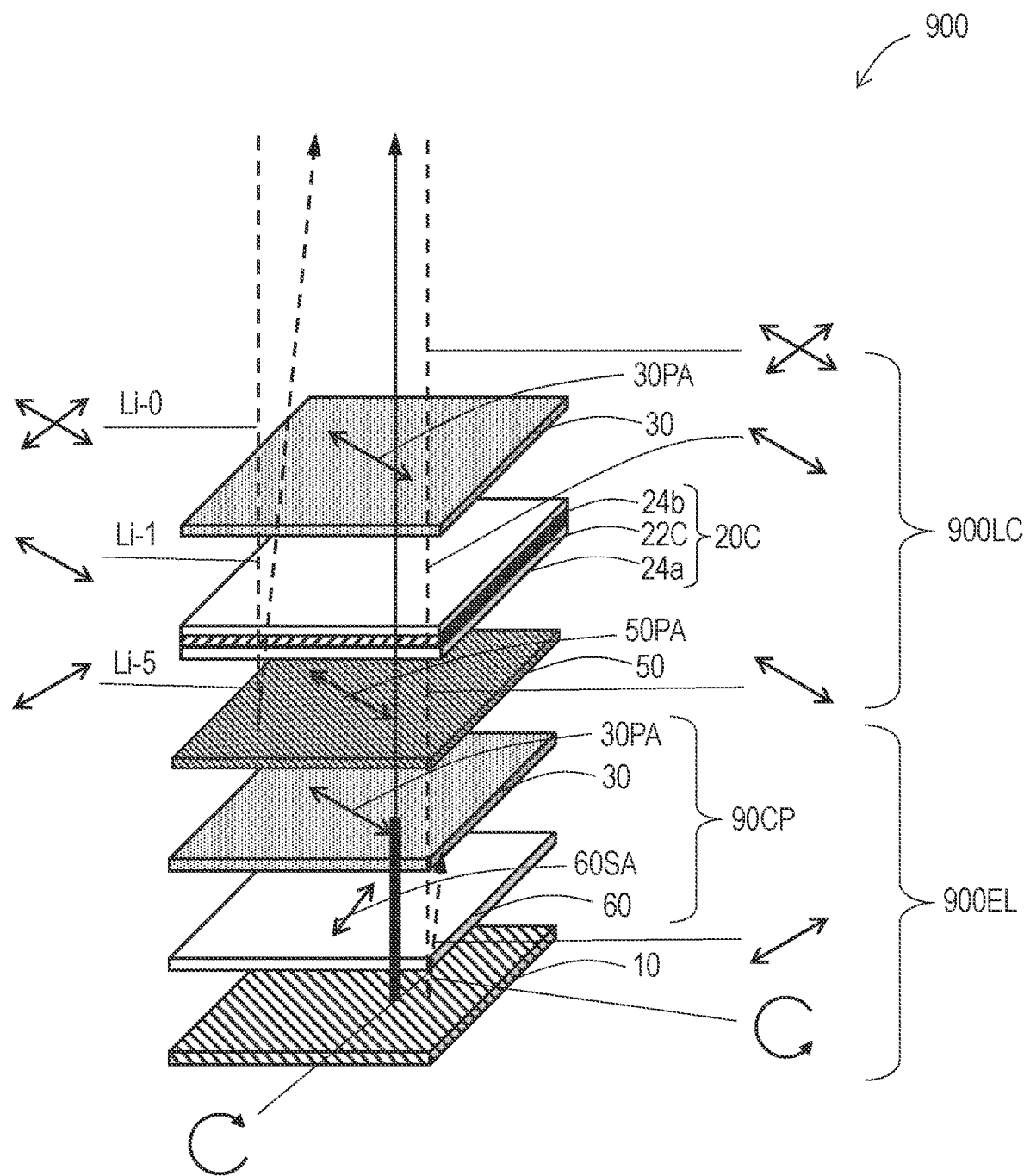
FIG. 10 is a schematic exploded perspective view of a display device according to a reference example, and shows an off-state (left) and an on-state (right).

For example, a display device 900 according to a reference example shown in FIG. 10 has a structure in which a reflective liquid crystal display element 900LC (hereinafter referred to as "reflective-polarizing-plate-type reflective liquid crystal display element") including a reflective polarizing plate and an organic EL display element 900EL are stacked on top of each other via an adhesive layer (not illustrated). The reflective-polarizing-plate-type reflective liquid crystal display element 900LC and the organic EL display element 900EL can perform a reflective display and a self-luminous display independently of each other.

A reflective-polarizing-plate-type liquid crystal element layer 20C includes two transparent substrates 24a and 24b and a liquid crystal layer 22C disposed between the two transparent substrates 24a and 24b, and is configured to be able to, by applying a voltage to the liquid crystal layer 22C, cause a substantially half-wavelength retardation in light passing through the liquid crystal layer 22C. A polarizing plate 30 is an absorption polarizing plate that absorbs linearly polarized light whose direction of polarization is orthogonal to a polarizing transmission axis 30PA. A reflective polarizing plate 50 reflects linearly polarized light whose direction of polarization is orthogonal to a polarizing transmission axis 50PA.

The organic EL display element 900EL includes an organic EL element layer 10 and a circularly polarizing plate 90CP. The circularly polarizing plate 90CP absorbs extraneous light falling on the organic EL element layer 10 and reflected off the organic EL element layer 10. As a matter of course, the circularly polarizing plate 90CP does not act on light falling on the liquid crystal element layer 20C and reflected off the liquid crystal element layer 20C.

In order for a display device that is capable of performing both a reflective display and a self-luminous display to be configured by stacking the publicly-known reflective-polarizing-plate-type reflective liquid crystal display element 900LC and the publicly-known organic EL display element 900EL, the circularly polarizing plate 90CP (which includes a combination of the absorption polarizing plate 30 and a phase difference plate 60) needs to be provided between the liquid crystal element layer 20C and the organic EL element layer 10. As a result of this, the absorption of organic EL display light during passage through the absorption polarizing plate 30 causes a decrease in efficiency in the use of the light. Further, regarding a reflective display, a state of polarization does not turn completely into linearly polarized light on the backside reflective polarizing plate 50 during two rounds of passage through a liquid crystal layer, depending on wavelengths (especially depending on the wavelength dispersiveness of liquid crystals). This generates a non-reflective component, which causes a decrease in efficiency in the use of the light.

Further, in a configuration in which a reflecting electrode is used as in the case of Japanese Patent No. 6700079, pixels of the organic EL element layer 10 need to be arranged so as to correspond to pixels of the liquid crystal element layer 20C, so that a high degree of alignment accuracy is desired. The liquid crystal element layer 20C typically includes a black matrix (i.e. a light shield that divides the pixels from one another) and a color filter layer, causing a decrease in efficiency in the use of light.

On the other hand, the display device 100 includes only the polarizing plate 30 disposed at a side of the liquid crystal element layer 20A that faces an observer, and has no polarizing plate between the liquid crystal element layer 20A and the organic EL element layer 10. This increases efficiency in the use of light of an organic EL display. Further, in a reflective display, efficiency in the use of light is increased, as the aforementioned backside light loss disappears. Further, it is preferable that the liquid crystal element layer 20A have no black matrix, and it is preferable that the liquid crystal element layer 20A have no color filter layer. Having no black matrix increases the degree of freedom in alignment and makes it possible to improve efficiency in the use of light. Further, having no color filter layer too increases the degree of freedom in alignment and makes it possible to improve efficiency in the use of light.

An operating state of the display device 100 in an off-state (which is here a state in which no voltage is applied to the liquid crystal layer 22A and no retardation is imparted to light passing through the liquid crystal layer 22A) is described with reference to FIG. 1A.

Passing through the polarizing plate 30 causes unpolarized extraneous light Li-0 to turn into linearly polarized light Li-1 parallel to the polarizing transmission axis 30PA, and passing through the phase difference plate 40 causes the unpolarized extraneous light Li-0 to turn, for example, into right-handed circularly polarized light Li-2. The right-handed circularly polarized light Li-2 keeps its state of polarization even after passing through the liquid crystal element layer 20A in an off-state, and falls on the organic EL element layer 10 as right-handed circularly polarized light Li-3. The circularly polarized light Li-3 is reflected off the organic El element layer 10 and turns into left-handed circularly polarized light Lr-1. This left-handed circularly polarized light Lr-1 keeps its state of polarization even after passing through the liquid crystal element layer 20A, and falls on the phase difference plate 40 as left-handed circularly polarized light Lr-3. Passing through the phase difference plate 40 causes the left-handed circularly polarized light Lr-3 to turn into linearly polarized light Li-3. The linearly polarized light Li-3 is absorbed by the polarizing plate 30, as the direction of polarization of the linearly polarized light Li-3 is a direction orthogonal to the linearly polarized light Li-1 and is orthogonal to the polarizing transmission axis 30A of the polarizing plate 30. That is, when in an off-state, the display device 100 displays black as a reflective display.

Meanwhile, when the display device 100 is in an on-state (which is here a state in which a voltage is applied to the liquid crystal layer 22A and a substantially quarter-wavelength retardation is caused in light passing through the liquid crystal layer 22A) shown in FIG. 1B, passing through the liquid crystal element layer 20A in an on-state causes the right-handed circularly polarized light Li-2 to turn into linearly polarized light Li-4. The direction of polarization of the linearly polarized light Li-4 is a direction orthogonal to the linearly polarized light Li-2. The linearly polarized light Li-4 falls on the organic EL element layer 10, is reflected off the organic EL element layer 10, and turns into linearly polarized light Lr-4. The linearly polarized light Lr-4 has the same direction of polarization as the linearly polarized light Li-4. The linearly polarized light Lr-4 passes through the liquid crystal element layer 20A in an on-state and turns into right-handed circularly polarized light Lr-5 that then falls on the phase difference plate 40. Having fallen on the phase difference plate 40, the right-handed circularly polarized light Lr-5 passes through the phase difference plate 40 and turns into linearly polarized light Lr-6. The linearly polarized light Lr-6 has the same direction of polarization as the linearly polarized light Li-1, and passes through the polarizing plate 30.

Assuming here, for example, that the transmittance of the polarizing plate 30 is 42%, the transmittance of the phase difference plate 40 is 100%, the transmittance of the liquid crystal element layer 20A is 85%, and the reflectance of the organic EL element layer 10 is 90%, reflected light Lr-7 emitted by the polarizing plate 30 is approximately 27% of the extraneous light Li-0. A reflective display based on this reflected light Lr-7 is a mirror display in the case of being specularly reflected off the organic EL element layer 10. A white display can be attained by providing a scattering layer 70 (e.g., display device 200A in FIG. 2C) between the organic EL element layer 10 and the liquid crystal element layer 20A. Depending on the degree of scattering, an intermediate display (that looks silver) between the mirror display and the white display can be attained. When a scattering layer that has polarization dependency and causes strong scattering at an azimuth angle of ±5 degrees with respect to the transmission axis 30PA of the polarizing plate 30 is used as this scattering layer 70, a higher contrast ratio can be attained than in a case where a common scattering layer that isotropically scatters light is used.

As the scattering layer, a phase-separated scattering layer (e.g. a Daicell's phase-separated AG film) that does not have a non-flat structure on a surface can be suitably used. Furthermore, as the scattering layer that has polarization dependency, for example, a DuPont Teijin Films' polarized scattering film (Japanese Patent No. 5468766) can be suitably used.

Light LE-1 emitted by the organic EL element layer 10 is unpolarized light, and whether in an on-state or in an off-state, a portion of the light LE-1 is absorbed by the polarizing plate 30. For example, when the transmittance of the polarizing plate 30 is 42%, light LE-2 that is used for a self-luminous display is 42% of the light LE-1.

In each of the on- and off-states described above, switching between the turning on and turning off of the organic EL element layer 10 can be done.

Figure 2A:
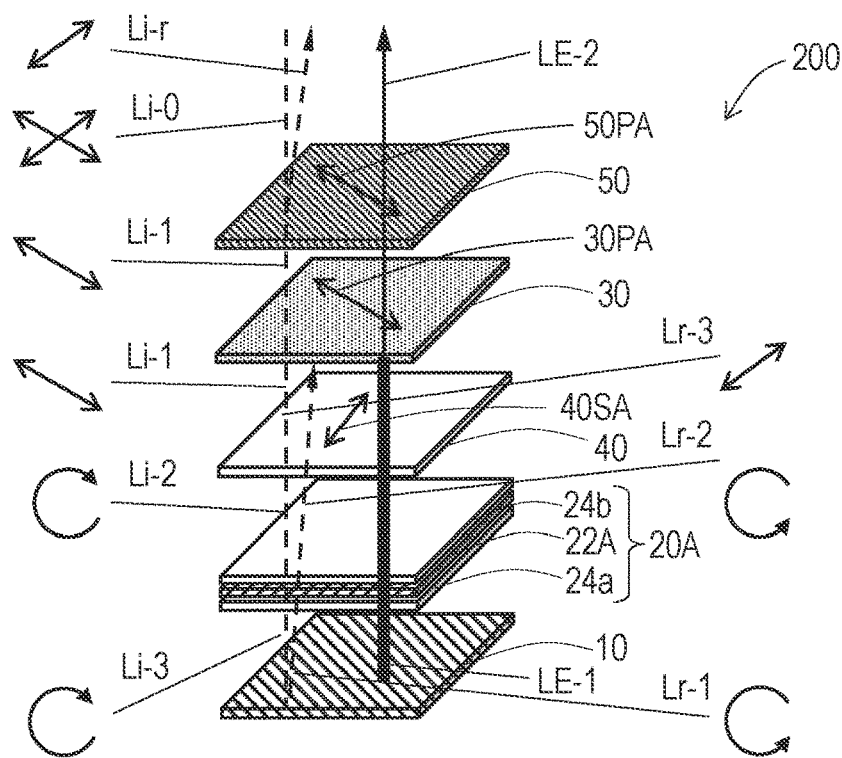
FIG. 2A is a schematic exploded perspective view of another display device according to the embodiment of the present disclosure, and shows an off-state.
Figure 2B:
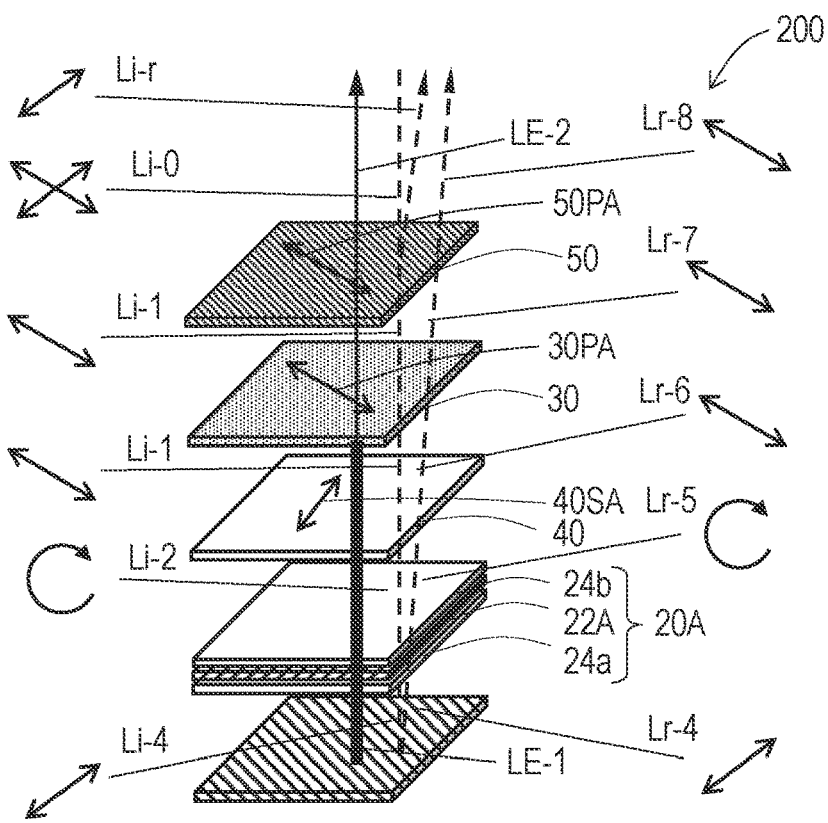
FIG. 2B is a schematic exploded perspective view of the display device shown in FIG. 2A, and shows an on-state.
Figure 2C:
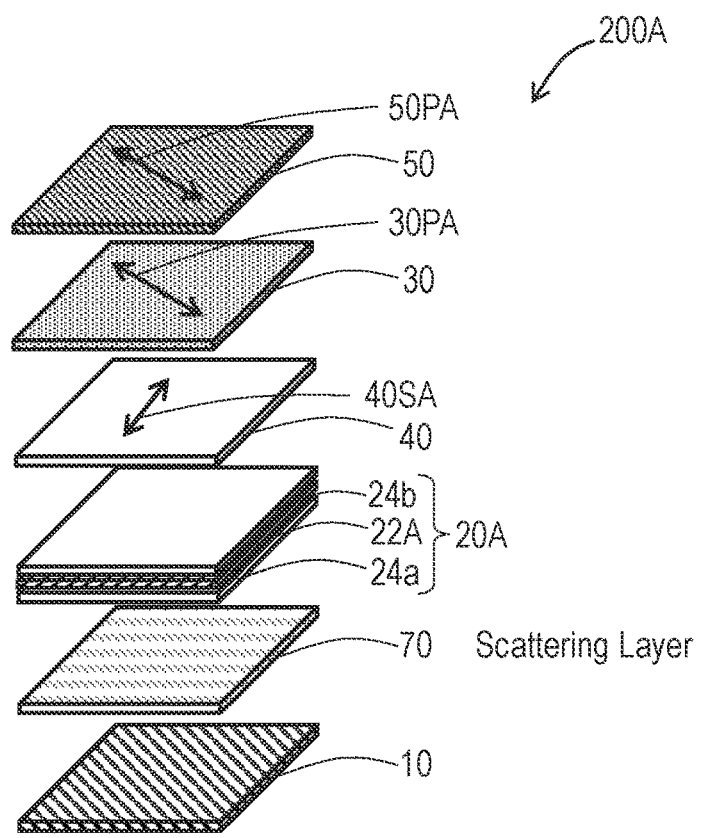
FIG. 2C is a schematic exploded perspective view of a display device according to another embodiment of the present disclosure.

Next, a configuration and operation of another display device 200 according to the embodiment of the present disclosure are described with reference to FIGS. 2A and 2B. FIGS. 2A and 2B illustrate schematic exploded perspective view of the display device 200. FIG. 2A shows an off-state, and FIG. 2B shows an on-state.

The display device 200 further includes a reflective polarizing plate 50 disposed at a side of the polarizing plate 30 of the display device 100 shown in FIGS. 1A and 1B that faces an observer, and the other components may be identical to those of the display device 100.

The reflective polarizing plate 50 allows passage of linearly polarized light parallel to a polarizing transmission axis 50PA and reflects linearly polarized light whose direction of polarization is orthogonal to the polarizing transmission axis 50PA. Assume that the linearly polarized light reflectance of the reflective polarizing plate 50 is 45%. Then, in the off-state shown in FIG. 2A, the display device 200 performs a reflective display with reflected light Li-r that is 45% of the extraneous light Li-0. Further, in the on-state shown in FIG. 2B, the display device 200 performs a reflective display with reflected light (Lr-8=Lr-7=27%+Lr-r=45%) that is 72% of the extraneous light Li-0.

Accordingly, the display device 200 can perform a brighter display than the display device 100. Note, however, that the display device 100 is superior in terms of a contrast ratio.

It should be noted that a scattering layer may be provided instead of the reflective polarizing plate 50. Providing a scattering layer makes it possible to perform a white or silver reflective display in an on-state.

Figure 2D:
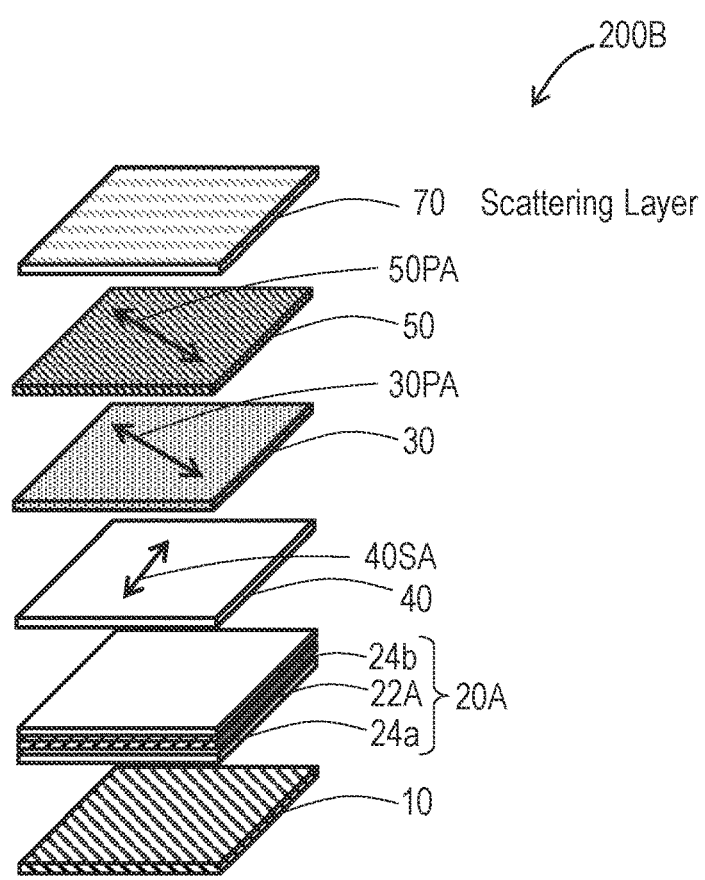
FIG. 2D is a schematic exploded perspective view of a display device according to yet another embodiment of the present disclosure.

Furthermore, a scattering layer 70 (e.g., display device 200B in FIG. 2D) may be provided at a side of the reflective polarizing plate 50 that faces an observer. Providing the reflective polarizing plate 50 makes it possible to, whether in an on-state or an off-state, perform a bright reflective display than in a case where only the scattering layer 70 is provided.

Next, an example of a structure of the organic EL element layer 10 is described with reference to FIG. 3. Although it is possible to use any of publicly-known various types of organic EL element layer as the organic EL element layer 10, it is preferable to use an organic EL element layer that has no color filter layer and whose individual organic EL elements can emit primary colors of light.

Figure 3:
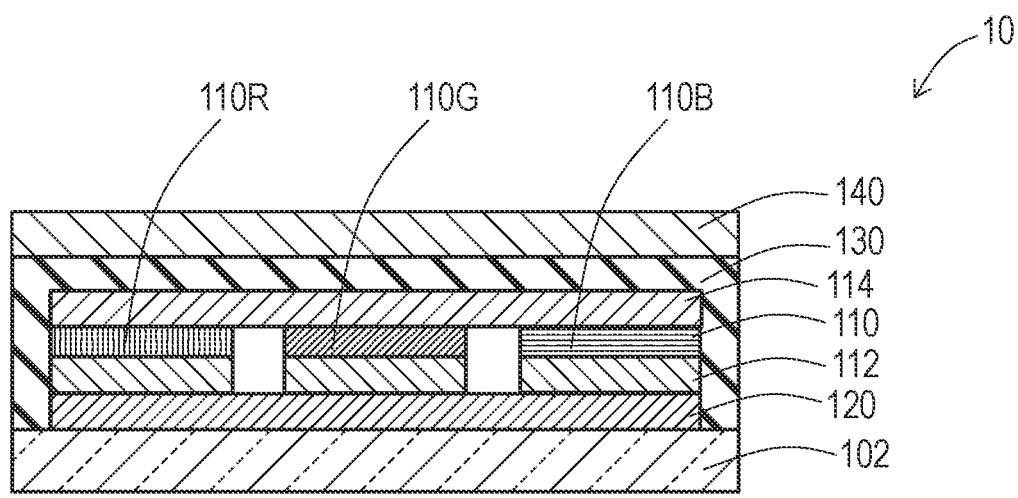
FIG. 3 is a schematic cross-sectional view of an organic EL element layer.

For example, the organic EL element layer 10, whose schematic cross-sectional view is shown in FIG. 3, includes a substrate 102, a backplane 120 formed on top of the substrate 102, an anode 112 formed on top of the backplane 120, an organic EL layer 110 formed on top of the anode 112, and a cathode 114 formed on top of the organic EL layer 110. The organic EL layer 110 includes an organic EL layer 110R that emits red light, an organic EL layer 110G that emits green light, and an organic EL layer 110B that emits blue light. Note here that reference signs 110R, 110G, and 110B, which refer to the organic EL layers, are also used as reference signs for organic EL elements (primary color pixels) that emit the respective colors (primary colors) of light. That is, the organic EL element layer 10 includes an organic EL element 110R that produces red, an organic EL element 110G that produces green, and an organic EL element 110B that produces blue. One pixel of the organic EL element layer 10 that is capable of a color display (hereinafter simply referred to as "pixel" and distinguished from "primary color pixel") is constituted by an organic EL element 110R that produces red, an organic EL element 110G that produces green, and an organic EL element 110B that produces blue. This is not the only combination of primary color pixels that constitute a pixel of the organic EL element layer 10.

As shown in FIG. 3, the anode 112 is provided for each organic EL element (primary color pixel), is formed, for example, by a metal layer (e.g. a stacked structure of silver and ITO with a thickness of 150 nm), and may have a reflectance of, for example, approximately 95%. The cathode 114 is one metal layer (e.g. a silver layer with a thickness of 10 nm) that is common to the plurality of organic EL elements (primary color pixels), e.g. all organic EL elements (primary color pixels), and has a reflectance of, for example, approximately 50%. The organic EL element layer 10 may have a reflectance of, for example, approximately 90% as a whole.

A thin-film sealing structure 130 is formed so as to entirely cover the organic EL elements 110R, 110G, and 110B and the backplane 120. The aforementioned scattering layer 140 is provided on top of the thin-film sealing structure 130. As is well known, the thin-film sealing structure 130 has a stack structure of an organic insulating layer and an inorganic insulating layer. It should be noted that a publicly-known transparent substrate (glass substrate, polyimide substrate) can be used as the substrate 102.

Figure 4:
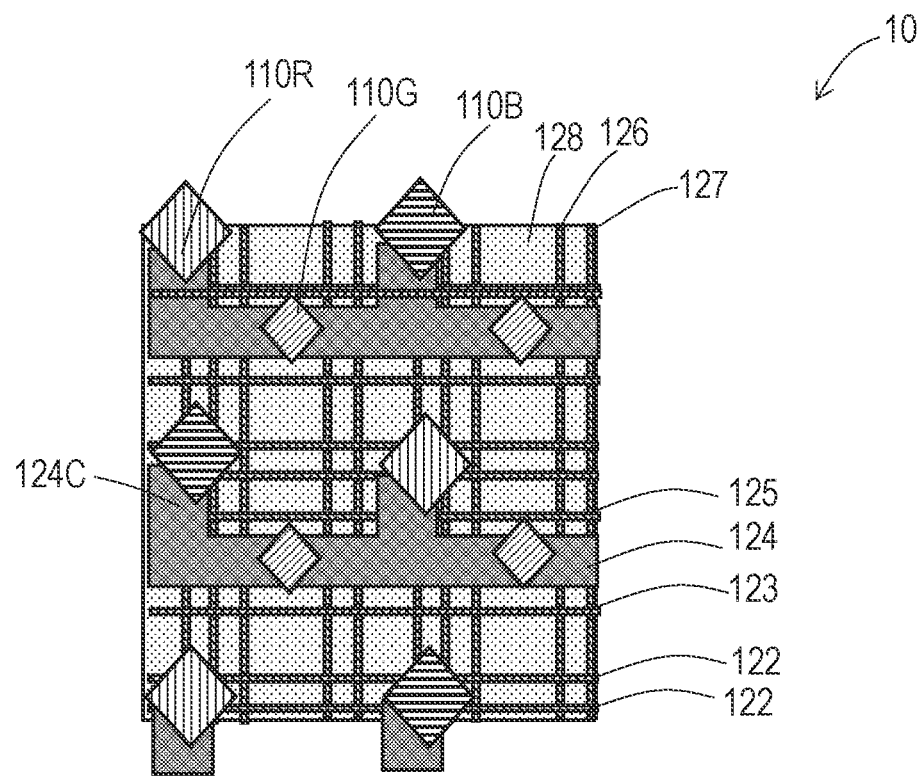
FIG. 4 is a schematic top view of the organic EL element layer.

Next, FIG. 4 is referred to. FIG. 4 is a schematic top view of the organic EL element layer 10, and schematically shows a configuration of a wiring layer, located at an uppermost layer of the backplane 120, that includes wires connected to the organic EL elements 110R, 110G, and 110B.

The wiring layer includes a power-supply line 122, a scan line 123, an emission line 125, and EL power-supply lines 126 and 127 (VDD, VSS). Further, the wiring layer includes a light-blocking pattern 124 for protecting a thin-film transistor (TFT; not illustrated), and the light-blocking pattern 124 has a projection 124C that also serves as an electrode of a capacitor.

Pixels of the liquid crystal element layer 20A are larger than the pixels of the organic EL element layer 10, as the liquid crystal element layer 20A performs a coarse display whereas the organic EL element layer 10 performs a high-definition display. That is, the pixels are arranged such that light emitted by two or more pixels of the organic EL element layer 10 passes through one pixel of the liquid crystal element layer 20A. For example, the pixels are arranged such that light emitted by ten or more or thirty or more pixels of the organic EL element layer 10 passes through one pixel of the liquid crystal element layer 20A.

As can be seen from FIG. 4, the organic EL element layer 10 has quite a few regions in which neither organic EL elements 110R, 110G, and 110B nor wires 122, 123, 124, 125, 126, and 127 or other lines are formed. Even if the cathode 114 (not illustrated in FIG. 4) is entirely formed, the reflectance is approximately 50%. To address this problem, a dummy wiring layer 128 formed from a metal layer with a reflectance of approximately 95% allows the organic EL element layer 10 to achieve a reflectance of, for example, approximately 90% as a whole. The dummy wiring layer 128 may be formed, for example, from the same metal material as the anode 112.

Next, a configuration of the liquid crystal element layer 20A and a method for driving the liquid crystal element layer 20A are described.

A configuration of a liquid crystal element layer that is subjected to segmented driving is described with reference to FIGS. 5, 6, and 7. The term "segmented driving" means driving by which voltages are individually applied on a pixel-by-pixel basis (separately to each of the segments) and by which a source driver concurrently applies voltages separately to each of the pixels.

Figure 5:
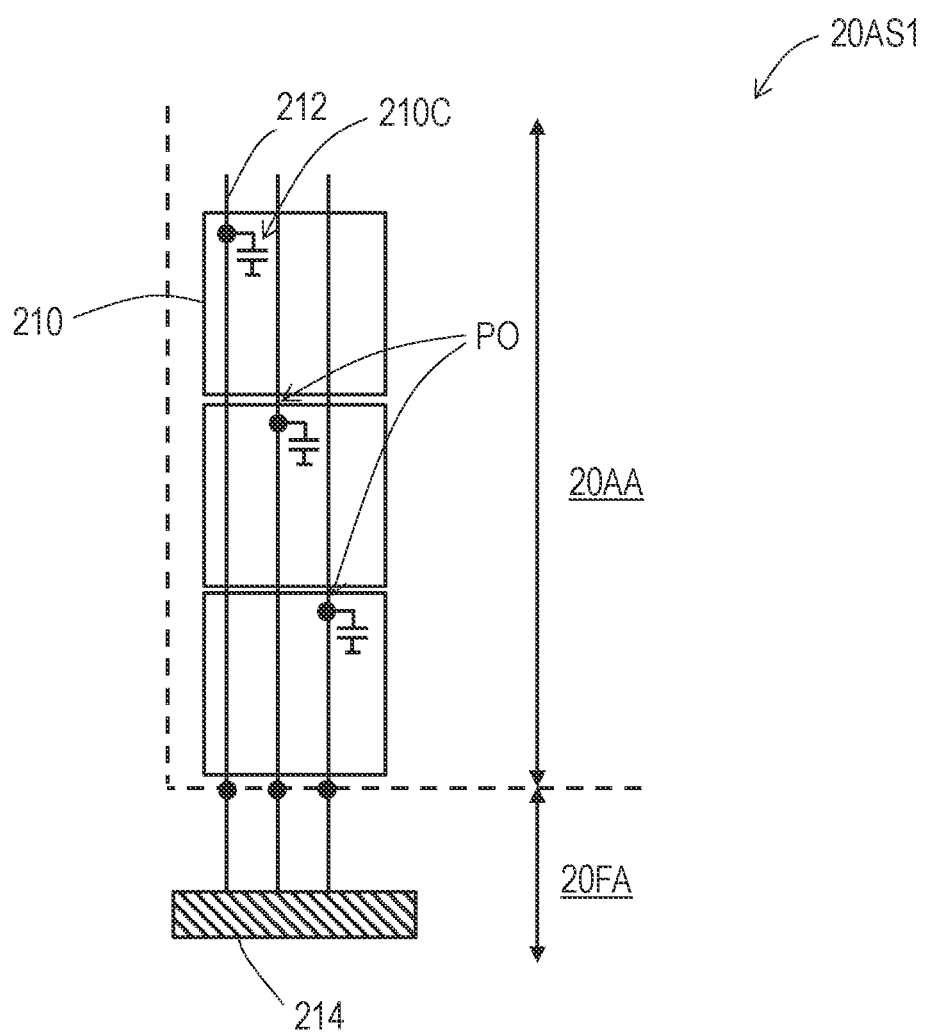
FIG. 5 is a schematic plan view of a liquid crystal element layer.

FIG. 5 is a schematic plan view of a liquid crystal element layer 20AS1 that is subjected to segmented driving. The liquid crystal element layer 20AS1 has an active area 20AA in which pixel electrodes 210 are arrayed, for example, in a matrix. FIG. 5 shows only three pixel electrodes 210, included in one column of pixel electrodes 210, that are closest to a frame area 20FA.

Display voltages are supplied from a source driver 214 separately to each of the pixel electrodes 210 via signal wires 212. A pixel capacitor 210C is formed by a pixel electrode 210, a liquid crystal layer (not illustrated) disposed on top of the pixel electrode 210, and a common electrode (not illustrated) disposed to face the pixel electrode 210 across the liquid crystal layer. The common electrode is typically formed as one conductive layer that faces all of the plurality of pixel electrodes 210. The pixel electrodes 210, the common electrode, and the signal wires 212 are each formed from a transparent conductive material (e.g. ITO or IZO). Portions of the signal wires 212 that are present in the frame area 20FA may be formed from metal (e.g. aluminum). The plurality of signal wires 212 include a signal wire 212 that overlaps two or more pixel electrodes 210. Further, a portion that is further away from the source driver 214 than a point of connection between a signal wire 212 and a pixel electrode 210 is electrically unnecessary and, for example, may therefore be cut off at a point P0. Note, however, that it is preferable, from the point of view of evenness of display, that the signal wires 212 be left. The liquid crystal element layer 20AS1 has no black matrix or color filter.

In the example shown here, the source driver 214 is disposed in the frame area 20FA, which is close to one end (lower end) of the active area 20AA of the liquid crystal element layer 20AS1. However, the source driver 214 may be disposed along two sides facing each other across the active area 20AA. Further, the source driver 214 may have a plurality of driver ICs disposed separately along each of the sides.

In the configuration shown in FIG. 5, one thousand source signal wires 212 need to be provided when the number of pixels is 1000. For example, even when source drivers are disposed above and below the active area 20AA, respectively, five hundred outputs need to be provided for each source driver. This may impose restrictions on the availability of source driver ICs and make it very difficult to secure sufficient space for routing of the signal wires 212 from the outputs of the source driver ICs. For example, for use in a watch, the active area is for example of a 1.7-inch type, and the liquid crystal element layer has for example a 30 by 30 formation of pixels.

Figure 6:
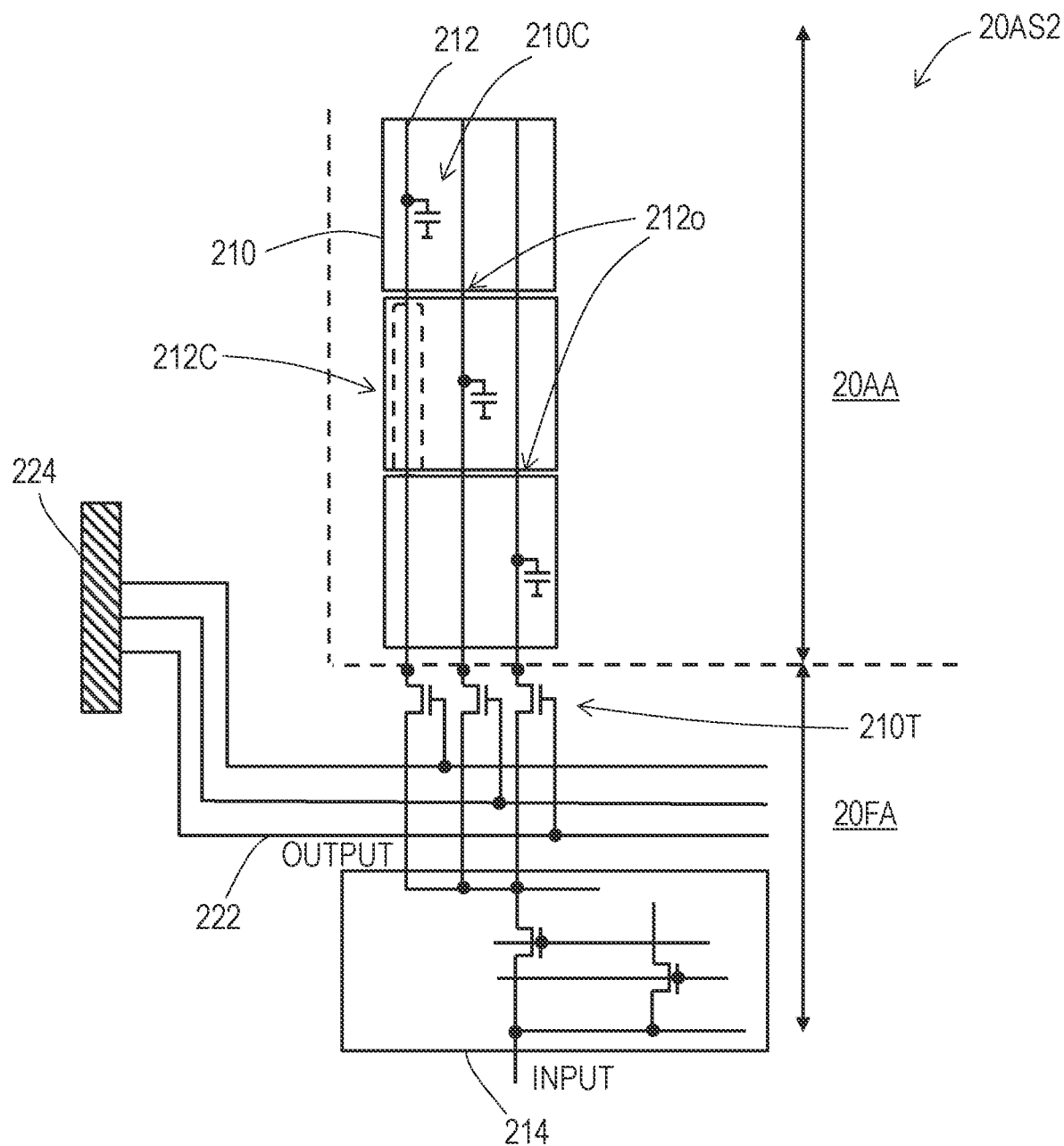
FIG. 6 is a schematic plan view of a liquid crystal element layer.

Accordingly, it is preferable to, as in the case of a liquid crystal element layer 20AS2 shown in FIG. 6, provide a plurality of thin-film transistors (TFTs) 210T each electrically connected to any of the pixel electrodes 210 and dispose the TFTs 210T outside the active area 20AA, i.e. in the frame area 20FA.

The liquid crystal element layer 20AS2 has provided in the frame area 20FA a gate driver 224 that supplies, to gate electrodes of the TFTs 210T via scanning lines 222, scanning signals for controlling the turning on and turning off of the TFTs 210T. That is, the TFTs 210T are equivalent to an arrangement in the frame area 20FA of TFTs (pixel TFTs) that a common active matrix liquid crystal display device has for each separate pixel. A portion of a signal wire 212 that is in the active area 20AA is formed from a transparent conductive material; therefore, this portion is comparatively great in line width, forms a large coupling capacitor 212C between the signal wire 212 and a pixel electrode 210, and may cause crosstalk and/or flicker.

It is conceivable that the coupling capacitor 212C may be made smaller by reducing the line width (or increasing the thickness) of the signal wire 212 and/or increasing the thickness of an organic insulating layer disposed between the pixel electrode 210 and the signal wire 212. Further, it is preferable to employ frame reverse driving by which the sign of a voltage that is applied to the liquid crystal layer is reversed every frame.

Take for example the case of a 60 by 60 array of pixels in a 1.7-inch square active area 20AA and assume that the signal wires are made of an IZO film with a sheet resistance of 50 ohm/□ and have a line width of 3 μm and the organic insulating layer has a thickness of 3 μm. Then, even in a case where a source driver is disposed on one side, the capacitance value of the pixel capacitor 210C is approximately 11 pf and the capacitance value of the coupling capacitor 212C is approximately 0.9 pf, so that Cc/Cp is approximately 0.08 and a time constant of approximately 7 μs is attained. In a case where source drivers are disposed on both sides, the capacitance value of the pixel capacitor 210C is approximately 11 pf and the capacitance value of the coupling capacitor 212C is approximately 0.5 pf, so that Cc/Cp is approximately 0.05 and a time constant of approximately 4 μs is attained.

Thus, Cc/Cp can be kept lower than or equal to 0.1 while a time constant smaller than or equal to 10 μs is ensured.

Figure 7:
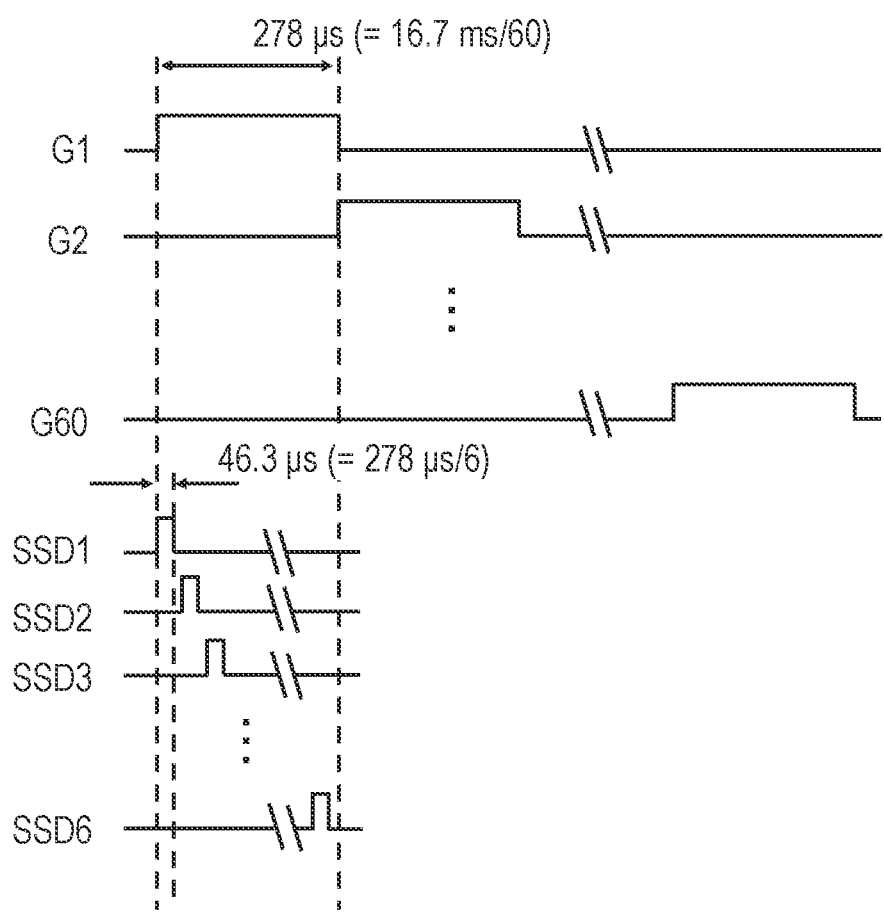
FIG. 7 is a driving timing chart of the liquid crystal element layer shown in FIG. 6.

FIG. 7 shows an example of a timing chart of driving of a display device having the aforementioned 60 by 60 array of pixels.

The timing chart here shows a case where the gate driver 224 in FIG. 6 has sixty outputs (G1 to G60), the source driver 214 has ten inputs, and each of the inputs outputs six pieces of data in a time-sharing manner (that is, a total of sixty pieces of data are outputted).

For example, when one vertical scanning period is 16.7 ms (that is, a vertical scanning frequency (refresh rate) is 60 Hz), each of the outputs G1 to G60 from the gate driver 224 supplies an on-voltage (which is high here) to the TFTs 210T in sequence for a duration of approximately 16.7 ms/60 278 μs. The source driver 214 receives ten inputs at a time and, by using SSD signals 1 to 6 to switch from one output destination to another in a time-sharing manner, supplies a total of sixty outputs as signal voltages to the signal wires 212 in sequence in a period of time during which each TFT 210T is in an on-state. Accordingly, the time during which a signal voltage is supplied to each pixel electrode is approximately 278 μm/6=approximately 46.3 μs. In this example, the outputs of the source driver ICs are connected to the TFTs 210T. To sixty of these TFTs turned on by the outputs from the gate driver 224, the SSD signals 1 to 6 transmit signals in sequence in a time-sharing manner. Therefore, refresh is performed in units of regions each composed of ten pixels.

As mentioned above, the signal wires 212, which are disposed in the active area 20AA, are formed from a transparent conductive material and therefore tend to have a large time constant. Accordingly, it is preferable to reduce the influence of the time constant by lengthening the time during which to supply the signal voltages. For example, using a gate driver 224 having ten outputs and six source driver ICs each having sixty outputs makes it possible to increase sixfold the time during which to supply a signal voltage to each pixel electrode.

Figure 8:
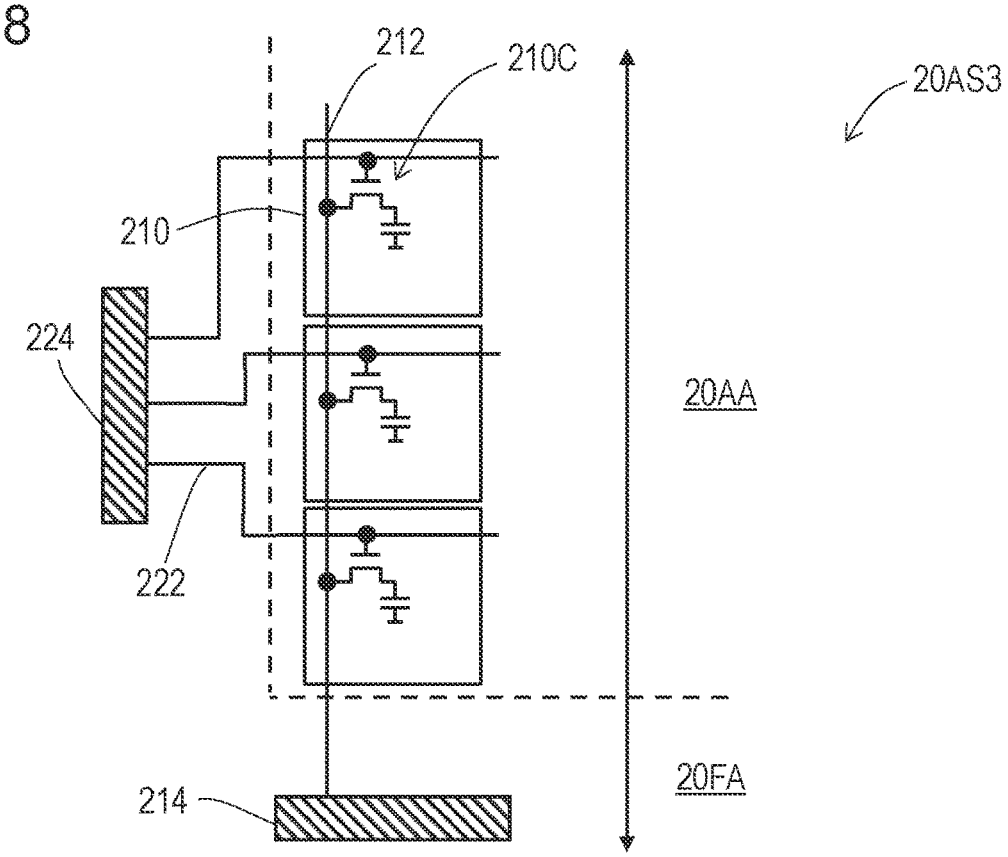
FIG. 8 is a schematic plan view of a liquid crystal element layer.

A display device according to an embodiment of the present disclosure may include a liquid crystal element layer 20AS3, shown in FIG. 8, that is similar in configuration to a normal active matrix liquid crystal display device. That is, TFTs 210C are disposed separately for each of the pixels arrayed in a matrix having rows and columns, the gate electrodes of the TFTs 210C of pixels belonging to one row are connected to the same scanning line (gate bus line) 222, and the source electrodes of the TFTs 210C of pixels belonging to one column are connected to the same signal wire (source bus line) 212.

Figure 9:
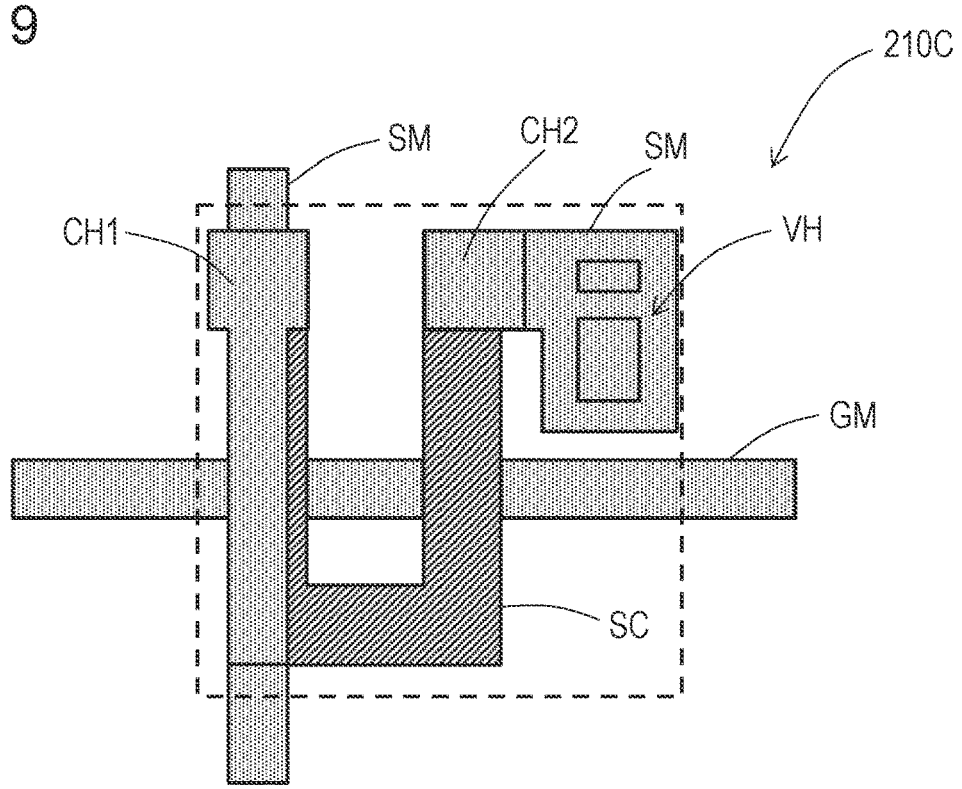
FIG. 9 is a schematic plan view showing an example configuration of a TFT.

FIG. 9 shows a schematic plan view of an example configuration of a TFT 210C that is disposed for each pixel. FIG. 9 schematically shows a gate metal layer GM, a semiconductor layer SC, a source metal layer SM, and a via hole VH, and a region surrounded by dashed lines is a region of formation of the TFT 210C. In this example, the width of the gate metal layer (gate bus line and gate electrode) GM is approximately 3 μm. The width of the semiconductor layer SC is approximately 4 μm. The width of the source metal layer (source bus line, source electrode) SM is approximately 4 μm. The length of each side of substantially square contact holes CH1 and CH2 is approximately 5 μm. A region of the source metal layer SM in which the via hole VH is formed has a transverse width of approximately 8 μm and a longitudinal length of approximately 10 μm. The region of formation of the TFT 210C is a square with side length approximately 25 μm.

Of the square TFT formation region with side length approximately 25 μm, a region in which the contact holes CH1 and CH2 with side length approximately 5 μm and the via hole VH approximately 8 μm wide and approximately 10 μm long are formed is hard to view in a reflective display.

For the configuration illustrated here, a relationship between the number of pixels and transmittance was estimated. When the number of pixels was 90000 (300×300), the length of each side of the TFT formation region was approximately 4 μm, and the transmittance was 0.93. When the number of pixels was 3600 (60×60), the length of each side of the TFT formation region was approximately 10 μm, and the transmittance was 0.99. When the number of pixels was 900 (30×30), the length of each side of the TFT formation region was approximately 50 μm, and the transmittance was 0.99. In a reflective display, light passes through the active area 20AA twice, so that twice as great a contribution is made.

A larger number of pixels results in a lower transmittance, and a smaller number of pixels results in a larger TFT formation region. A TFT formation region with side length approximately 10 μm or greater is easy to view. In a case where the configuration of a normal active matrix liquid crystal display device is employed, it is preferable that the configuration of TFTs be optimized according to the application in view of these facts.

A display device according to an embodiment of the present disclosure is suitably applied, for example, to a watch.

The present disclosure contains subject matter related to that disclosed in Japanese Priority Patent Application JP 2022-014177 filed in the Japan Patent Office on Feb. 1, 2022, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
an organic EL element layer;
a liquid crystal element layer disposed on top of the organic EL element layer; and
a polarizing plate disposed at a side of the liquid crystal element layer that faces an observer,
wherein
the liquid crystal element layer includes two transparent substrates and a liquid crystal layer disposed between the two transparent substrates,
the liquid crystal element layer is configured to, by applying a voltage to the liquid crystal layer, cause a substantially quarter-wavelength retardation in light passing through the liquid crystal layer, and
the liquid crystal element layer and the polarizing plate are configured to perform a reflective display using light reflected within the organic EL element layer.

2. The display device according to claim 1, further comprising a phase difference plate disposed between the liquid crystal element layer and the polarizing plate.

3. The display device according to claim 1, further comprising a first scattering layer disposed between the organic EL element layer and the liquid crystal element layer,
wherein the first scattering layer has polarization dependency and causes scattering at an azimuth angle of ±5 degrees with respect to a transmission axis of the polarizing plate.

4. The display device according to claim 1, further comprising a reflective polarizing plate disposed at a side of the polarizing plate that faces an observer.

5. The display device according to claim 1, further comprising a second scattering layer disposed at a side of the polarizing plate that faces an observer.

6. The display device according to claim 1, wherein the organic EL element layer and the liquid crystal element layer both have color filter layers.

7. The display device according to claim 1, wherein the liquid crystal element layer has no black matrix.

8. The display device according to claim 1, wherein no polarizing plate is provided between the liquid crystal element layer and the organic EL element layer.

9. A display device comprising:
an organic EL element layer;
a liquid crystal element layer disposed on top of the organic EL element layer; and
a polarizing plate disposed at a side of the liquid crystal element layer that faces an observer,
wherein
the liquid crystal element layer includes two transparent substrates and a liquid crystal layer disposed between the two transparent substrates,
the liquid crystal element layer is configured to be able to, by applying a voltage to the liquid crystal layer, cause a substantially quarter-wavelength retardation in light passing through the liquid crystal layer,
the organic EL element layer has a plurality of first pixels,
the plurality of first pixels includes a plurality of primary color pixels,
the liquid crystal element layer has a plurality of second pixels, and
each of the plurality of second pixels is disposed to allow passage of light emitted by two or more of the plurality of first pixels.

10. The display device according to claim 9, wherein
each of the plurality of second pixels has a pixel electrode,
the display device further comprises a plurality of thin-film transistors each electrically connected to the pixel electrode of any of the plurality of second pixels,
wherein the plurality of thin-film transistors is disposed outside an active area in which the plurality of second pixels is arrayed.

11. The display device according to claim 10, wherein a plurality of signal wires connecting the plurality of thin-film transistors to pixel electrodes of the plurality of second pixels includes signal wires that overlap two or more of the pixel electrodes.

12. The display device according to claim 11, wherein the plurality of signal wires is formed from a transparent conductive material.

13. The display device according to claim 9, wherein the plurality of thin-film transistors is arrayed along two sides that are facing each other across the active area.

14. The display device according to claim 9, further comprising an organic insulating layer disposed between a plurality of signal wires and a plurality of pixel electrodes of the plurality of second pixels,
wherein the organic insulating layer has a thickness greater than approximately 3 μm.

15. The display device according to claim 9, wherein the liquid crystal element layer and the polarizing plate are configured to perform a reflective display using light reflected within the organic EL element layer.

16. The display device according to claim 15, wherein the liquid crystal element layer has no reflective layer.

17. The display device according to claim 1, wherein the organic EL element layer comprises an anode, an organic EL layer, and a cathode.

18. The display device according to claim 1, wherein the organic EL element layer comprises an anode, an organic EL layer, a cathode, and a dummy wiring layer formed from a same metal material as the anode.

19. The display device according to claim 1, wherein the liquid crystal element layer has no reflective layer.

* * * * *